United States Patent
Ko et al.

(10) Patent No.: US 9,153,538 B2
(45) Date of Patent: Oct. 6, 2015

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Chung-Chi Ko, Nantou (TW); Pei-Wen Huang, New Taipei (TW); Chih-Hao Chen, Hsin-Chu (TW); Kuang-Yuan Hsu, Taichung (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/973,626

(22) Filed: Aug. 22, 2013

(65) Prior Publication Data
US 2015/0054170 A1    Feb. 26, 2015

(51) Int. Cl.
*H01L 23/532* (2006.01)
*H01L 21/768* (2006.01)

(52) U.S. Cl.
CPC ...... *H01L 23/5329* (2013.01); *H01L 21/76846* (2013.01); *H01L 23/53238* (2013.01); *H01L 23/53295* (2013.01)

(58) Field of Classification Search
CPC . H01L 21/768; H01L 21/4763; H01L 21/469; H01L 23/5226; H01L 23/53238
USPC .................. 257/751, 758, 762, 774, E21.575; 438/618, 687
See application file for complete search history.

(56) References Cited

U.S. PATENT DOCUMENTS

| | | | |
|---|---|---|---|
| 2004/0087135 A1* | 5/2004 | Canaperi et al. | 438/628 |
| 2005/0184397 A1* | 8/2005 | Gates et al. | 257/774 |
| 2005/0250346 A1* | 11/2005 | Schmitt | 438/778 |
| 2008/0105978 A1* | 5/2008 | Schmitt et al. | 257/751 |
| 2009/0273085 A1* | 11/2009 | Jourdan et al. | 257/751 |
| 2010/0041227 A1* | 2/2010 | Bhavnagarwala et al. | 438/618 |
| 2011/0006429 A1* | 1/2011 | Liu et al. | 257/751 |
| 2011/0101529 A1* | 5/2011 | Kao et al. | 257/751 |

OTHER PUBLICATIONS

Nitta, S., et al., "Successful Dual Damascene Integration of Extreme Low k Materials (k<2.0) Using a Novel Gap Fill Based Integration Scheme," IEEE International Electron Devices Meeting, 2004, pp. 321-324.

\* cited by examiner

*Primary Examiner* — Karen Kusumakar
*Assistant Examiner* — Adam S Bowen
(74) *Attorney, Agent, or Firm* — Slater & Matsil, L.L.P.

(57) ABSTRACT

Semiconductor devices and methods of manufacture thereof are disclosed. In some embodiments, a semiconductor device includes conductive features disposed over a workpiece, each conductive feature including a conductive line portion and a via portion. A barrier layer is disposed on sidewalls of each conductive feature and on a bottom surface of the via portion of each conductive feature. The barrier layer includes a dielectric layer. A first insulating material layer is disposed beneath a portion of the conductive line portion of each conductive feature. A second insulating material layer is disposed between the conductive features. A third insulating material layer is disposed beneath the first insulating material layer and the second insulating material layer. A lower portion of the via portion of each of the conductive features is formed within the third insulating material layer. The second insulating material layer has a lower dielectric constant than a dielectric constant of the first insulating material layer and a dielectric constant of the third insulating material layer.

20 Claims, 6 Drawing Sheets

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically manufactured by providing a workpiece, forming various material layers over the workpiece, and patterning the various material layers using lithography to form integrated circuits.

The semiconductor industry continues to improve the integration density of various electronic components of integrated circuits, i.e., transistors, diodes, resistors, capacitors, etc., by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials and extra-low k (ELK) materials that have dielectric constants less than that of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to manufacturing methods and structures for semiconductor devices. Semiconductor devices and methods of manufacture thereof will be described herein that comprise novel methods of forming dual damascene interconnects that utilize hybrid insulating materials for inter-metal dielectric (IMD) layers.

Figure 1:
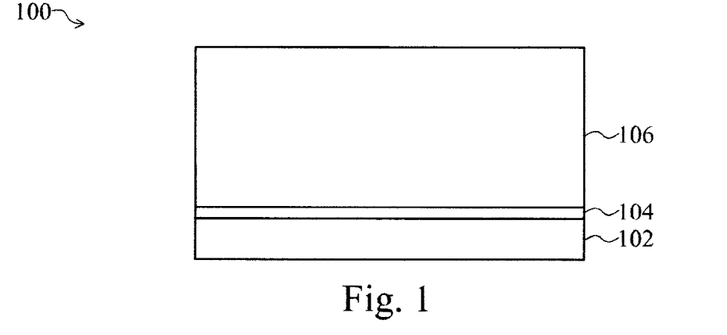
FIGS. 1 through 3 and FIGS. 5 through 9 illustrate cross-sectional views of a semiconductor device at various stages of manufacturing in accordance with some embodiments of the present disclosure.

FIGS. 1 through 3 and FIGS. 5 through 9 illustrate cross-sectional views of a semiconductor device 100 at various stages of manufacturing in accordance with some embodiments of the present disclosure. Referring first to FIG. 1, there is shown a cross-sectional view of a semiconductor device 100. To manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. In some embodiments, the workpiece 102 comprises an interposer substrate of a packaging device, as another example.

An etch stop layer 104 is deposited or formed over the workpiece 102, as shown in FIG. 1. The etch stop layer 104 comprises a material with an etch selectivity to a subsequently deposited insulating material layer 106. The etch stop layer 104 comprises a material that etches more slowly than insulating material layer 106, for example. The etch stop layer 104 comprises an insulating material comprising two or more combinations of materials such as Si, C, N, O, H, or B in some embodiments, for example. The etch stop layer 104 comprises a compound such as silicon oxide, silicon nitride, silicon carbide, silicon boride, amorphous boron, boron nitride, other materials, or multiple layers or combinations thereof in some embodiments, as examples. The etch stop layer 104 comprises a thickness of about 25 Angstroms to about 500 Angstroms in some embodiments. Alternatively, the etch stop layer 104 may comprise other dimensions and materials. The etch stop layer 104 may be formed using chemical vapor deposition (CVD), physical vapor deposition (PVD), or other methods.

The insulating material layer 106 is deposited or formed over the etch stop layer 104, also shown in FIG. 1. The insulating material layer 106 is also referred to herein as a first insulating material layer 106. The insulating material layer 106 comprises a dielectric material such as carbon or carbon/hydrogen doped silicon dioxide (SiOCH), other insulators, or combinations or multiple layers thereof, as examples. The insulating material layer 106 comprises a thickness of about 300 Angstroms to about 1,000 Angstroms, as examples. In some embodiments, the insulating material layer 106 has a dielectric constant or k value of about 3.0 or greater, for example. In other embodiments, the insulating material layer 106 has a k value of about 2.4 or greater. The insulating material layer 106 comprises a low k material having a dielectric constant of less than about 3.9, which is the dielectric constant of silicon dioxide. The insulating material layer 106 may be formed by a CVD process, a plasma enhanced CVD (PECVD) process, a spin-on process, or a PVD process, as examples. Alternatively, the insulating material layer 106 may comprise other materials and dimensions, and may be formed using other methods.

The insulating material layer 106 comprises a relatively dense material. The first insulating material layer 106 is more dense than a subsequently deposited second insulating material layer 126 (not shown in FIG. 1; see FIG. 8) in some embodiments. The first insulating material layer 106 is less porous than the second insulating material layer 126. The first insulating material layer 106 comprises a porosity of about 5% to about 15% in some embodiments, for example. The first insulating material layer 106 has a dielectric constant that is greater than a dielectric constant of the second insulating material layer 126 in some embodiments. Alternatively, the first insulating material layer 106 and second insulating material layer 126 may have other properties and other relative properties.

Figure 2:
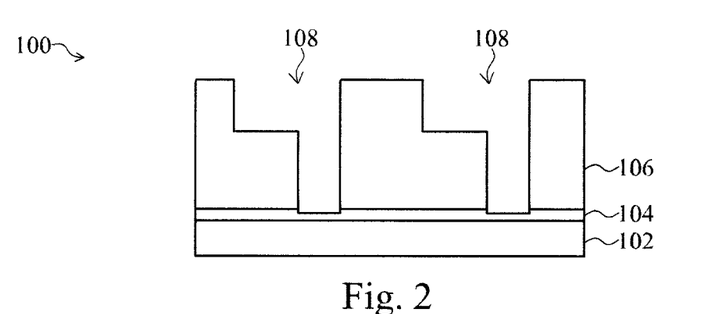

Next, the first insulating material layer 106 is patterned using a lithography process, using the etch stop layer 104 as an etch stop, as shown in FIG. 2. For example, a layer of photoresist (not shown) may be deposited over the first insulating material layer 106. The layer of photoresist is patterned using lithography with a desired pattern for insulating material layer 106. The layer of photoresist may be patterned by exposing the layer of photoresist to energy transmitted through or reflected from a lithography mask having a desired pattern thereon. The layer of photoresist is developed, and then exposed or unexposed portions (depending on whether the photoresist is positive or negative) of the photoresist are ashed or etched away. The insulating material layer 106 is then exposed to an etch process, removing portions of the insulating material layer 106 not covered by the layer of photoresist. Portions of the etch stop layer 104 may also be removed during the etch process, as shown in FIG. 2. The layer of photoresist is then removed.

The first insulating material layer 106 is patterned using a dual damascene process in accordance with some embodiments to form patterns 108 for conductive features. For example, the patterns 108 for conductive features in the first insulating material layer 106 may comprise upper portions that comprise patterns for conductive lines and lower portions that comprise patterns for conductive vias. Two photoresist layers, photolithography steps, and etch steps may be used to form the pattern 108 in the first insulating material layer 106; one photolithography and etch step to form the conductive line portions of the patterns 108 and another photolithography and etch step to form the via portions of the patterns 108, for example. A via-first or a conductive line-first dual damascene method may be used. Alternatively, the via and conductive line patterns may be separately patterned using two lithography steps onto a single layer of photoresist, and then etched simultaneously. In some embodiments, the first insulating material layer 106 may be directly patterned with the dual damascene patterns 108. Other dual damascene methods may also be used to form the patterns 108 in the first insulating material layer 106.

The etch stop layer 104 functions as an endpoint detector in the etch process used to pattern the insulating material layer 106, e.g., the etch process used to form the lower via portion of the conductive feature pattern. The chemicals in the chamber the semiconductor device 100 is placed in for the etch process may be monitored to detect one or more components of the etch stop layer 104, for example. When the one or more components of the etch stop layer 104 is detected, the etch process is discontinued, for example. The thickness of etch stop layer 104 may be selected so that substantially all of etch stop layer 104 is removed when the etch process reaches the etch stop layer 104 or that some of the etch stop layer 104 is left remaining, for example, in some embodiments. In other embodiments, the endpoint detection system or method may involve monitoring chemicals of the etch process to detect when one or more components of etch stop layer 104 ceases to be detected, upon which point the etch process is discontinued, as another example. Alternatively, other types of endpoint detection methods may be used to determine when the etch stop layer 104 has been reached, indicating that the etch process for the insulating material layer 106 should be discontinued.

Figure 3:
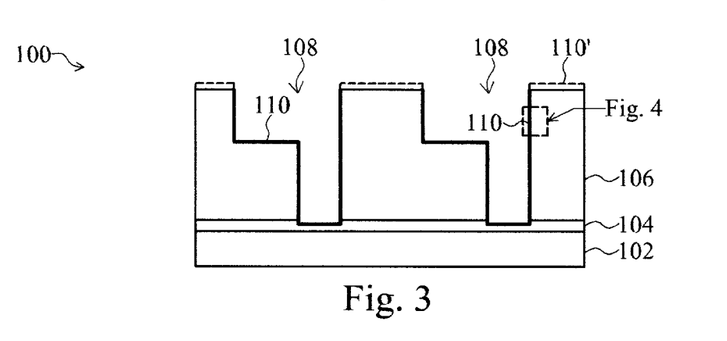
Figure 4:
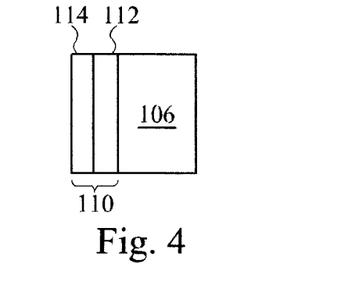
FIG. 4 is a more detailed view of a portion of FIG. 3 in accordance with some embodiments.

A barrier layer 110 is then formed over the patterns 108 in the first insulating material layer 106, as shown in FIG. 3. A portion of the barrier layer 110 may also be formed over the top surface of the first insulating material layer 106 in some embodiments, as shown in phantom (e.g., in dashed lines) at 110' in FIG. 3. A more detailed view of a portion of FIG. 3 is shown in FIG. 4, which illustrates a barrier layer 110 that comprises multiple layers in accordance with some embodiments.

In some embodiments, the barrier layer 110 comprises a single layer comprising a dielectric layer 112. The dielectric layer 112 comprises a dielectric material that is adapted to function as a barrier. In other embodiments, the barrier layer 110 comprises a dielectric layer 112 and a metal layer 114 disposed over the dielectric layer 112. The metal layer 114 comprises a metal material that is adapted to function as a barrier.

The dielectric layer 112 comprises a material such as SiN, SiCN, SiC, BN, BNSi, amorphous B, or combinations or multiple layers thereof in some embodiments. The dielectric layer 112 of the barrier layer 110 comprises a thickness of about 5 Angstroms to about 100 Angstroms in some embodiments. In other embodiments, the dielectric layer 112 comprises a thickness of about 10 Angstroms to about 30 Angstroms. The dielectric layer 112 is formed using PECVD or atomic layer deposition (ALD) in some embodiments. In some embodiments, the patterned first insulating material layer 106 is pre-treated before the dielectric layer 112 is formed. The pre-treatment may comprise $NH_3$, $N_2$, $H_2$, other substances, or combinations thereof, as examples. The pre-treatment improves adhesion between a subsequently deposited conductive material 120 (see FIG. 5) and the first insulating material layer 106 in some embodiments. Alternatively, the dielectric layer 112 may comprise other materials and dimensions, may be formed using other methods, and a pre-treatment may not be used.

The metal layer 114 is included in the barrier layer 110 in some embodiments. The metal layer 114 is not included in the barrier layer 110 in other embodiments. The metal layer 114 is formed over the dielectric layer 112, as illustrated in FIG. 4. The metal layer 114 comprises TaN, TiN, Co, Ta, Ru, Ti, or combinations or multiple layers thereof in some embodiments. The metal layer 114 comprises a thickness of about 5 Angstroms to about 100 Angstroms in some embodiments. The metal layer 114 comprises a thickness of about 10 Angstroms to about 30 Angstroms in other embodiments. Alternatively, the metal layer 114 may comprise other materials or dimensions. The metal layer 114 is deposited using ALD, sputtering, CVD, PECVD, plasma enhanced ALD (PEALD), or other methods, as examples.

Figure 5:
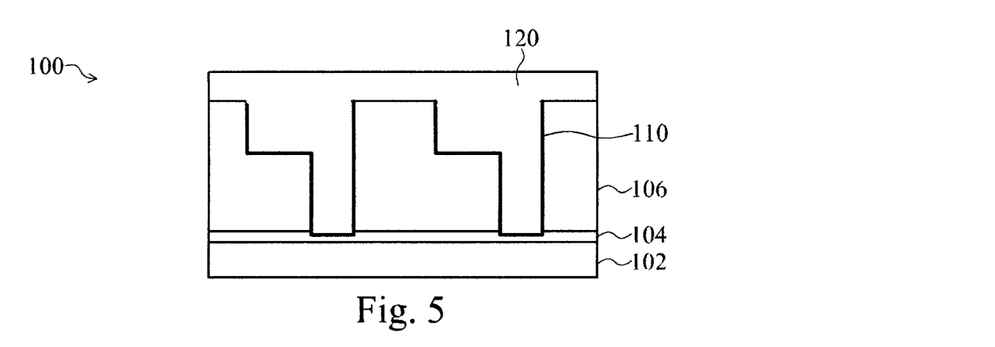

Referring next to FIG. 5, a conductive material 120 is then deposited or formed over the patterned insulating material layer 106. The conductive material 120 comprises copper, a copper alloy, a conductive liner, a seed layer, or combinations or multiple layers thereof, as examples. The conductive material 120 may be sputtered on, or may be formed by CVD, PVD, or plating, as examples. Alternatively, the conductive material 120 may comprise other materials and may be formed using other methods. The conductive material 120 fills the patterns in the insulating material layer 106 and portions of or the entire thickness of the etch stop layer 104 over the barrier layer 110.

Figure 6:
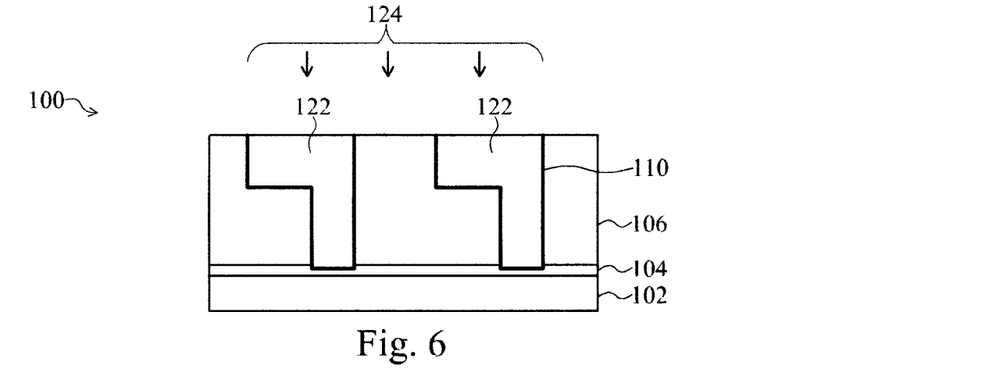

A chemical-mechanical polishing (CMP) process, grinding process, and/or etch process is then used to remove excess conductive material 120 from over the top surface of the insulating material layer 106, as shown in FIG. 6, forming conductive features 122 from the conductive material 120 within the insulating material layer 106. If the barrier layer 110' was also formed on the top of the insulating material layer 106, the barrier layer 110' is also removed, in some embodiments. The conductive features 122 comprise upper portions that comprise conductive line portions and lower portions that comprise via portions. The upper conductive line portions of the conductive features 122 may extend in-and-out of the paper in the view shown by a predetermined distance, and may have meandering, straight, or other patterns in a top view of the workpiece 102. The via portions of the conductive features 122 may be round, oval, square or other shapes in a top view of the workpiece 102.

Figure 7:
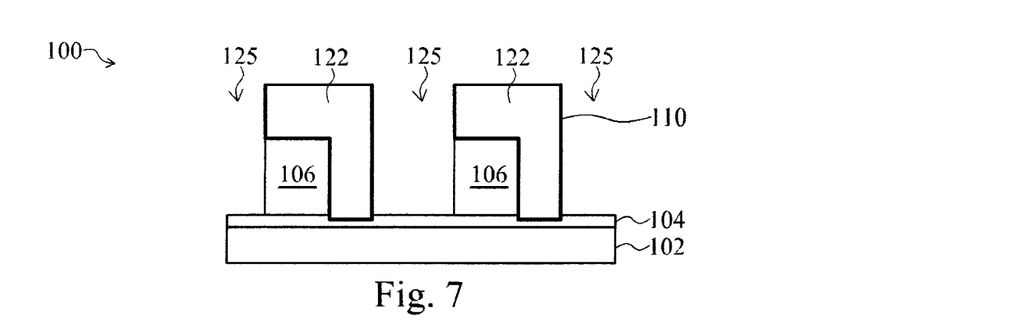

An etch process 124 is then used to remove the insulating material layer 106 from between adjacent conductive features 122, as shown in FIGS. 6 and 7. The etch process 124 comprises a dry etch back process or other type of anisotropic etch process in some embodiments. A dry etch process using plasma oxide or a gas including $C_4F_8$, $N_2$, $O_2$, Ar, other substances, or combinations thereof is used to remove the insulating material layer 106 from between the conductive features 122 in some embodiments, as examples. Other types of etch processes may alternatively be used.

The barrier layer 110 facilitates in protecting the sidewalls of the conductive features 122 during the etch process 124. Due to the shape of the conductive features 122 having the wider upper conductive line portion and the narrower lower via portion, a portion of the insulating material layer 106 is left remaining beneath a portion of the upper conductive line portion of each conductive feature 122. The portion of the insulating material layer 106 is left remaining adjacent one or more sides of the lower via portions of the conductive features 122. Spaces or gaps 125 are left disposed between the conductive features 122.

Figure 8:
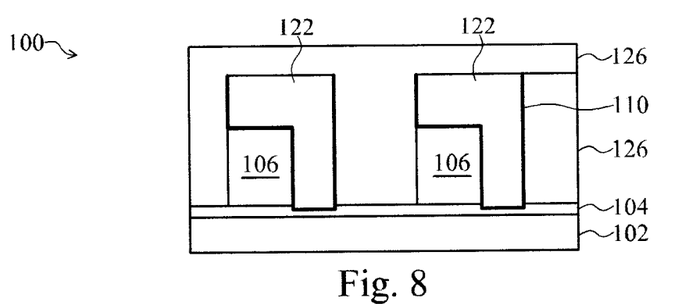

Next, the spaces or gaps 125 between the conductive features 122 are filled with a second insulating material layer 126, as shown in FIG. 8. The second insulating material layer 126 is formed between the conductive features 122. The second insulating material layer 126 comprises a dielectric material such as SiOCH, other insulators, or combinations or multiple layers thereof, as examples. The second insulating material layer 126 has a different dielectric constant than the first insulating material layer 106 in some embodiments. In some embodiments, the insulating material layer 126 has a dielectric constant (k) value of about 3.0 or less, for example. In other embodiments, the insulating material layer 126 has a k value of about 2.4 or 2.5 or less. The insulating material layer 126 comprises a low k material having a dielectric constant of less than about 3.9 in some embodiments. The insulating material layer 126 may be formed by a spin-on process, an ALD process, or a flowable process, as examples. Alternatively, the insulating material layer 126 may comprise other materials and may be formed using other methods.

The insulating material layer 126 comprises a relatively porous material. The second insulating material layer 126 is more porous and less dense than the first insulating material layer 106. The second insulating material layer 126 comprises a porosity of about 15% or greater in some embodiments, for example. The second insulating material layer 126 comprises a lower dielectric constant than a dielectric constant of the first insulating material layer 106 in some embodiments. In other embodiments, the insulating material layer 126 comprises an ELK material, as another example. The second insulating material layer 126 comprises a different material than the first insulting material layer 106 in some embodiments, for example.

The resulting semiconductor device 100 structure comprising a plurality of dual damascene-formed conductive features 122 that are insulated by a hybrid IMD comprising the first insulating material layer 106 and the second insulating material layer 126. The weaker, more porous, lower-k value second insulating material layer 126 between adjacent conductive features 122 provides improved RC performance, and the more mechanically strong, denser, higher-k value first insulating material layer 106 disposed beneath a portion of the conductive features 122 provides a more robust conductive feature structure.

In some embodiments, a material quantity ratio of the first insulating material layer 106 to the second insulating material layer 126 comprises about 1:3 to about 3:1. The total insulating material percentage of the semiconductor device 100 comprises about 25% to about 75% of the denser first insulating material layer 106 in some embodiments, for example.

Figure 10:
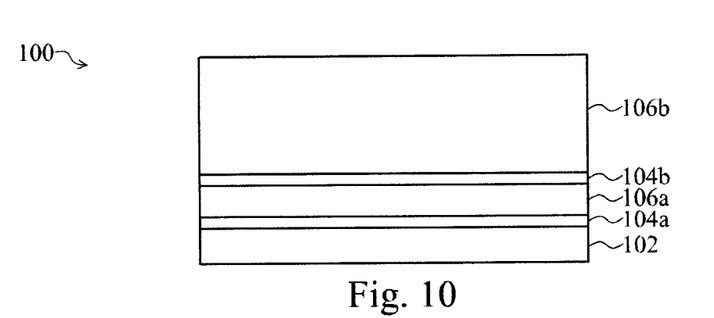
FIGS. 10 through 17 are cross-sectional views of a semiconductor device at various stages of manufacturing in accordance with some embodiments.

FIGS. 10 through 17 illustrate cross-sectional views of a semiconductor device 100 at various stages of manufacturing in accordance with other embodiments of the present disclosure. Referring next to FIG. 10, two etch stop layers 104a and 104b are implemented in the IMD, and an additional insulating material layer 106a is also included. A first etch stop layer 104a is formed over a workpiece 102, and a first insulating material layer 106a is formed over the first etch stop layer 104a. A second etch stop layer 104b is formed over the first insulating material layer 106a. A second insulating material layer 106b is formed over the second etch stop layer 104b.

The first etch stop layer 104a and the second etch stop layer 104b may comprise similar materials, dimensions, and formation methods as described for etch stop layer 104 of the embodiments shown in FIG. 1. Alternatively, the first etch stop layer 104a and the second etch stop layer 104b may comprise different materials and dimensions described for etch stop layer 104 of the embodiments shown in FIG. 1.

The first insulating material layer 106a comprises a low dielectric constant material such as SiOCH, other insulators, or combinations or multiple layers thereof in some embodiments. Alternatively, the first insulating material layer 106a may comprise other materials. The first insulating material layer 106a comprises a thickness of about 100 to about 1,000 Angstroms in some embodiments. In some embodiments, the first insulating material layer 106a may comprise the same material as the second insulating material layer 106b, or the first insulating material layer 106a may comprise a different material than the second insulating material layer 106b. Alternatively, the first insulating material layer 106a may comprise other materials and dimensions. The first insulating material layer 106a comprises a dense low-k material having about a 30% to 70% total dense layer thickness, in some embodiments. The first insulating material layer 106a is formed using PECVD process in some embodiments.

Figure 11:
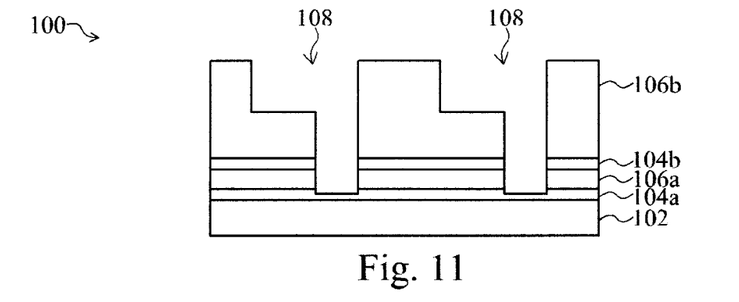

The manufacturing process flow continues similar to the embodiments shown in FIGS. 2, 3, and 5 through 9. However, the process flow differs because of the presence of the first etch stop layer 104a and the second etch stop layer 104b that are separated by the first insulating material layer 106a. In FIG. 11, the patterns 108 for conductive features are formed through the entire thickness of the second insulating material layer 106b, the second etch stop layer 104b, and the first insulating material layer 106a, and also partially or fully through the first etch stop layer 104a. In some embodiments, the patterns 108 are not formed in the first etch stop layer 104a. The first etch stop layer 104a is used as an etch stop during the dual damascene patterning process used to form the patterns 108.

Figure 12:
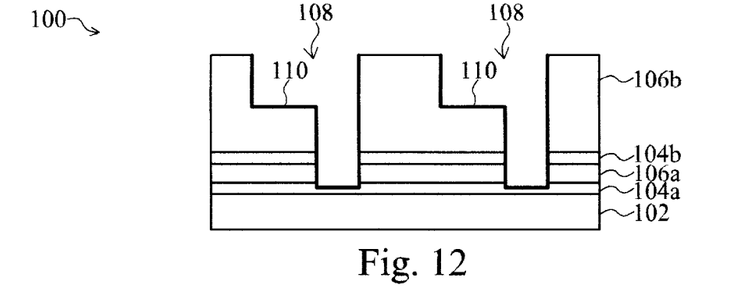
Figure 13:
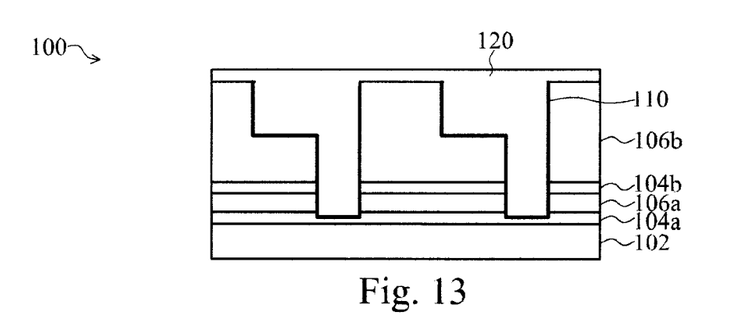
Figure 14:
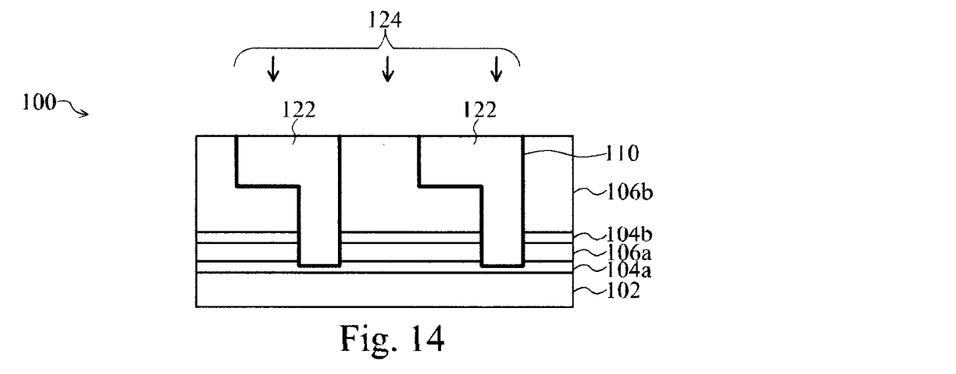

The second insulating material layer 106b and the first insulating material layer 106a are pretreated in some embodiments, as described for the embodiments shown in FIGS. 1 through 9, before the barrier layer 110 is formed. The barrier layer 110 is formed over the patterns 108, as shown in FIG. 12, and conductive material 120 is formed over the top surface of the second insulating material layer 106b, filling the patterns 108, as shown in FIG. 13. The barrier layer 110 and conductive material 120 comprise similar materials, dimensions, and formation methods described for the previous embodiments, in some embodiments. A CMP, grinding, and/or etch process is used to remove excess conductive material 120 from over the top surface of the second insulating material layer 106b, as shown in FIG. 14.

Figure 15:
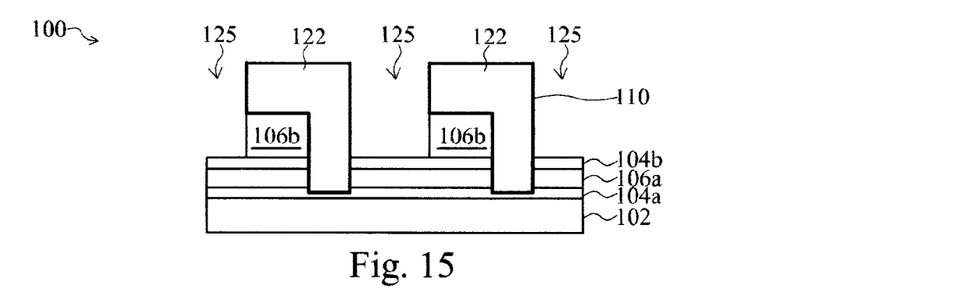
Figure 16:
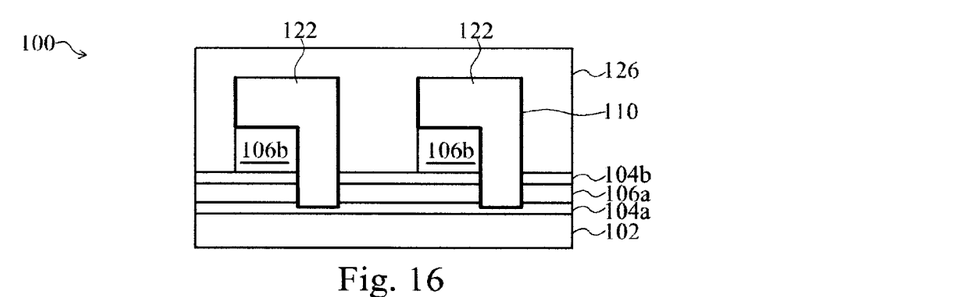

An etch process 124 is used to remove the second insulating material layer 106b from between adjacent conductive features 122, as shown in FIG. 15, forming spaces or gaps 125 between the upper portion of the conductive features 122. The second etch stop layer 104b is used as an etch stop during the etch process 124 used to remove the second insulating material layer from between the conductive features 122. A third insulating material layer 126 is formed over and between the conductive features 122, as shown in FIG. 16. The third insulating material layer 126 comprises similar materials, properties, and formation methods as described for the second insulating material layer 126 shown in FIG. 8 in some embodiments. Excess portions of the third insulating material layer 126 are then removed from over the conductive features 122, as shown in FIG. 17.

In accordance with some embodiments, a material quantity ratio of the denser first insulating material layer 106a and the second insulating material layer 106b to the more porous third insulating material layer 126 comprises about 1:3 to about 3:1. The total insulating material percentage of the semiconductor device 100 comprises about 25% to about 75% of the denser first insulating material layer 106a and second insulating material layer 106b in some embodiments, for example.

Figure 9:
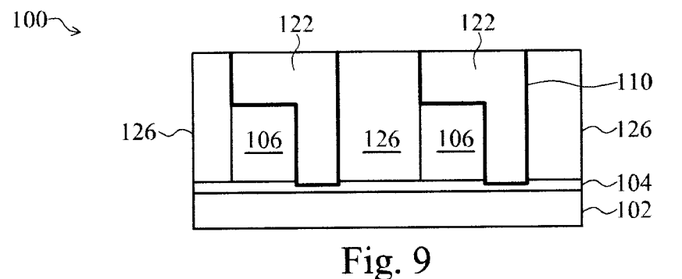
Figure 17:
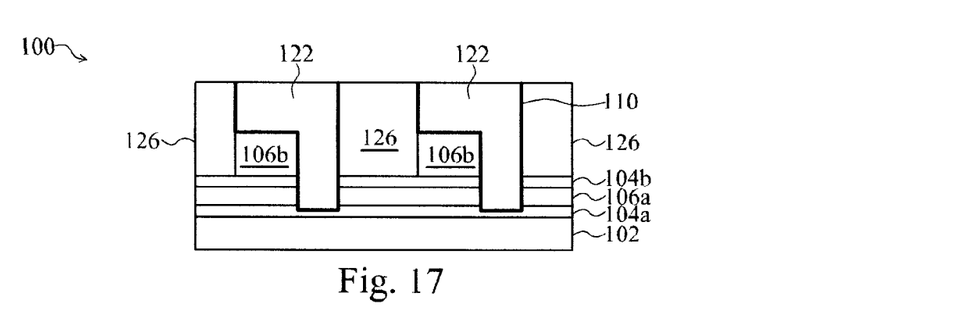

After the manufacturing process steps shown in FIGS. 9 and 17, the fabrication process for the semiconductor device 100 is then continued. Additional material layers (not shown) may be formed over the semiconductor device 100, and individual integrated circuits may be singulated from the semiconductor device 100 and later packaged in single packages, multi-chip packages, or directly mounted in an end application (also not shown). The semiconductor device 100 including the novel IMD and interconnect structure may alternatively comprise a packaging device such as an interposer that is used to package other semiconductor die or dies.

Figure 18:
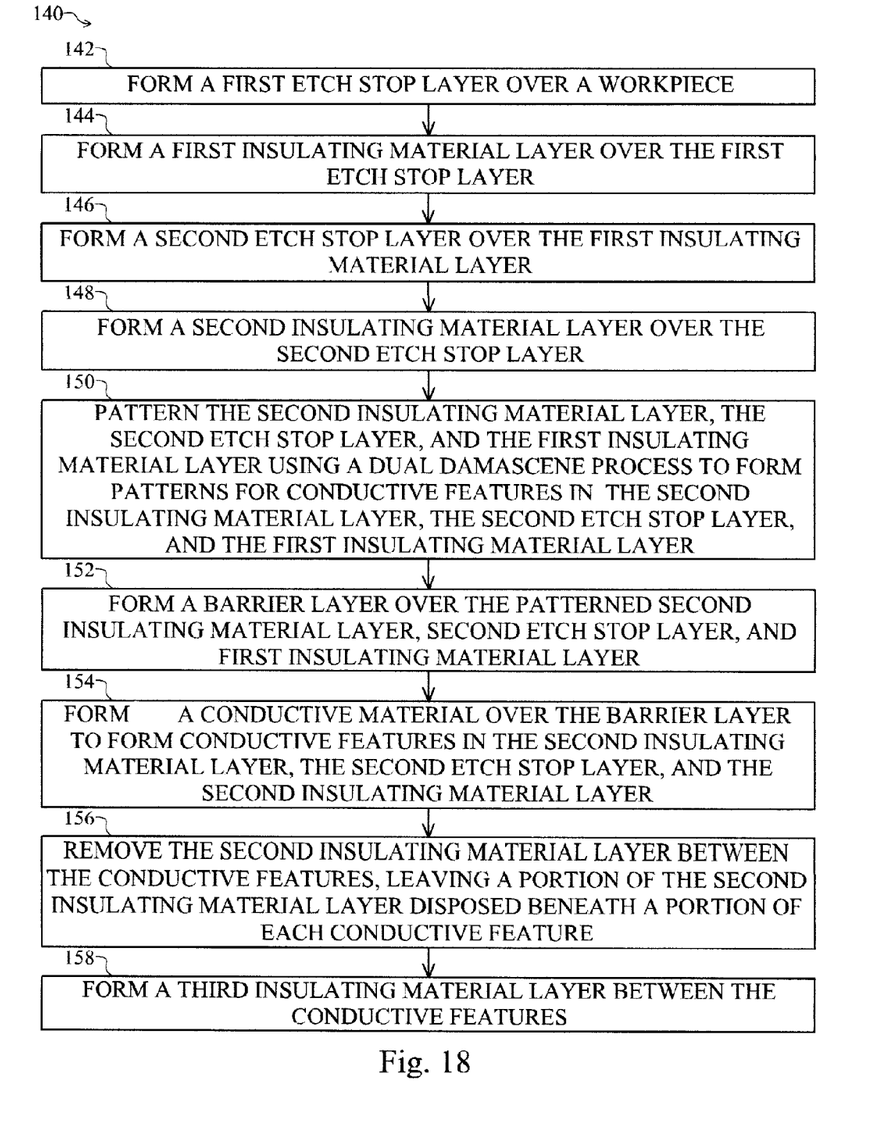
FIG. 18 is a flow chart of a method of manufacturing a semiconductor device in accordance with some embodiments.

FIG. 18 is a flow chart 140 of a method of manufacturing a semiconductor device 100 in accordance with some embodiments. In step 142, a first etch stop layer 104a is formed over a workpiece 102 (see also FIG. 10). In step 144, a first insulating material layer 106a is formed over the first etch stop layer 104a. In step 146, a second etch stop layer 104b is formed over the first insulating material layer 106a. In step 148, a second insulating material layer 106b is formed over the second etch stop layer 104b. In step 150, the second insulating material layer 106b, the second etch stop layer 104b, and the first insulating material layer 106a are patterned using a dual damascene process to form patterns for conductive features in the second insulating material layer 106b, the second etch stop layer 104b, and the first insulating material layer 106a (see FIG. 11). In step 152, a barrier layer 110 is formed over the patterned second insulating material layer 106b, the second etch stop layer 104b, and the first insulating material layer 106a (see FIG. 12). In step 154, a conductive material 120 is formed over the barrier layer 110 to form conductive features 122 in the second material layer 106b, the second etch stop layer 104b, and the first insulating material layer 106a (see FIGS. 13 and 14). In step 156, the second insulating material layer 106b is removed between the conductive features 122, leaving a portion of the second insulating material layer 106b disposed beneath a portion of each conductive feature 122 (see FIG. 15). In step 158, a third insulating material layer 126 is formed between the conductive features 122 (see FIGS. 16 and 17).

Some of the insulating material layers 106, 126, 106a, and 106b are also referred to herein (e.g., in some of the claims) as a first, second, and/or third insulating material layer 106, 126, 106a, and 106b, depending on the order of introduction. Likewise, some of the etch stop layers 104, 104a, and 104b are also referred to herein as a first and/or second etch stop layer 104, 104a, and 104b.

Advantages of some embodiments of the disclosure include providing novel semiconductor devices 100 and methods of manufacture thereof that include hybrid IMD structures. Novel methods of forming dual damascene interconnects are described, wherein a denser, higher k insulating material is used beneath portions of conductive line portions of conductive features, and a more porous, lower k insulating material is used between the conductive features. Some embodiments utilize one etch stop layer, and other embodiments utilize two etch stop layers, improving control of the formation of the conductive features and the various insulating material layers, and improving etch back control of the insulating material layer 106b.

Hybrid low-k materials with different dielectric constants are used in the IMD to achieve a novel film scheme with improved properties and integration ability. An etch-back of insulating material layer 106 or 106b is combined with a gap-fill with a porous insulating material layer 126 to achieve the hybrid low-k IMD. Damage to conductive features is avoided, and line distortion of the low-k materials is avoided, which is particularly advantageous in reduced scale dimension applications. The barrier layer 110 prevents damage to the conductive features during the dry etch back of insulating material layer 106 or 106b. Implementing the barrier layer comprising a dielectric material further achieves a low-R benefit. In addition, the novel hybrid IMD structures and designs are easily implementable in manufacturing process flows.

In accordance with some embodiments of the present disclosure, a semiconductor device includes a plurality of conductive features disposed over a workpiece, each of the plurality of conductive features including a conductive line portion and a via portion. A barrier layer is disposed on sidewalls of each of the plurality of conductive features and on a bottom surface of the via portion of each of the plurality of conductive features. A first insulating material layer is disposed beneath a portion of the conductive line portion of each of the plurality of conductive features. A second insulating material layer is disposed between each of the plurality of conductive features. A third insulating material layer is disposed beneath the first insulating material layer and the second insulating material layer. A lower portion of the via portion of each of the plurality of conductive features is formed within the third insulating material layer. The second insulating material layer comprises a lower dielectric constant than a dielectric constant of the first insulating material layer or a dielectric constant of the third insulating material layer.

In accordance with other embodiments, a semiconductor device includes a first etch stop layer disposed over a workpiece, and a first insulating material layer disposed over the first etch stop layer. A second etch stop layer is disposed over the first insulating material layer. A plurality of conductive features is disposed over the workpiece, each of the plurality of conductive features including a conductive line portion and a via portion. A portion of the via portion of each of the plurality of conductive features is formed in the first insulating material layer and the second etch stop layer. A barrier layer is disposed on sidewalls of each of the plurality of conductive features and on a bottom surface of the via portion of each of the plurality of conductive features. A second insulating material layer is disposed beneath a portion of the conductive line portion of each of the plurality of conductive features over the second etch stop layer. A third insulating material layer is disposed between each of the plurality of conductive features. The third insulating material layer comprises a lower dielectric constant than a dielectric constant of the first insulating material or a dielectric constant of the second insulating material layer.

In accordance with other embodiments, a method of manufacturing a semiconductor device includes forming a first etch stop layer over a workpiece, forming a first insulating material layer over the first etch stop layer, and forming a second etch stop layer over the first insulating material layer. The second insulating material layer, the second etch stop layer, and the first insulating material layer are patterned using a dual damascene process to form patterns for a plurality of conductive features in the second insulating material layer, the second etch stop layer, and the first insulating material layer. The method includes forming a barrier layer over the patterned second insulating material layer, second etch stop layer, and first insulating material layer. A conductive material is formed over the barrier layer to form a plurality of conductive features in the second insulating material layer, the second etch stop layer, and the first insulating material layer. The method includes removing the second insulating material layer between the plurality of conductive features, leaving a portion of the second insulating material layer disposed beneath a portion of each of the plurality of conductive features. A third insulating material layer is formed between the plurality of conductive features.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a plurality of conductive features disposed over a workpiece, each of the plurality of conductive features including a conductive line portion and a via portion;
   a barrier layer disposed on sidewalls of each of the plurality of conductive features and on a bottom surface of the via portion of each of the plurality of conductive features;
   a first etch stop layer disposed over the workpiece;
   a first insulating material layer disposed beneath a portion of the conductive line portion of each of the plurality of conductive features;
   a second etch sop layer disposed over the first insulating layer, wherein a portion of each of the plurality of conductive features is formed in the first insulating layer and the second etch stop layer;
   a second insulating material layer disposed between each of the plurality of conductive features; and
   a third insulating material layer disposed beneath the first insulating material layer and the second insulating material layer, wherein a lower portion of the via portion of each of the plurality of conductive features is formed within the third insulating material layer, and wherein the second insulating material layer comprises a lower dielectric constant than a dielectric constant of the first insulating material layer or a dielectric constant of the third insulating material layer.

2. The semiconductor device according to claim 1, wherein the barrier layer includes a dielectric layer.

3. The semiconductor device according to claim 2, wherein the dielectric layer comprises a material selected from the group consisting essentially of: SiN, SiCN, SiC, BN, BNSi, amorphous B, and combinations thereof.

4. The semiconductor device according to claim 2, wherein the dielectric layer comprises a thickness of about 5 Angstroms to about 100 Angstroms.

5. The semiconductor device according to claim 2, wherein the barrier layer further comprises a metal layer disposed over the dielectric layer.

6. The semiconductor device according to claim 1, wherein the first insulating material layer or the third insulating material comprises a porosity of about 5% to about 15% or a dielectric constant (k) of about 2.4 or greater.

7. The semiconductor device according to claim 1, wherein the second insulating material layer comprises a porosity of about 15% or greater or a dielectric constant (k) of about 3.0 or less.

8. A semiconductor device, comprising:
   a first etch stop layer disposed over a workpiece;
   a first insulating material layer disposed over the first etch stop layer;
   a second etch stop layer disposed over the first insulating material layer;
   a plurality of conductive features disposed over the workpiece, each of the plurality of conductive features including a conductive line portion and a via portion, a portion of the via portion of each of the plurality of conductive features being formed in the first insulating material layer and the second etch stop layer;
   a barrier layer disposed on sidewalls of each of the plurality of conductive features and on a bottom surface of the via portion of each of the plurality of conductive features;

a second insulating material layer disposed beneath a portion of the conductive line portion of each of the plurality of conductive features over the second etch stop layer; and a third insulating material layer disposed between each of the plurality of conductive features, wherein the third insulating material layer comprises a lower dielectric constant than a dielectric constant of the first insulating material layer or a dielectric constant of the second insulating material layer.

9. The semiconductor device according to claim 8, wherein the first insulating material layer, the second insulating material layer, or the third insulating material layer comprises SiOCH.

10. The semiconductor device according to claim 8, wherein the first etch stop layer or the second etch stop layer comprises a material selected from the group consisting essentially of: silicon oxide, silicon nitride, silicon carbide, silicon boride, amorphous boron, boron nitride, and combinations thereof.

11. The semiconductor device according to claim 8, wherein the first etch stop layer or the second etch stop layer comprises a thickness of about 25 Angstroms to about 500 Angstroms.

12. The semiconductor device according to claim 8, wherein a material quantity ratio of the first insulating material layer and the second insulating material layer to the third insulating material layer comprises about 1:3 to about 3:1.

13. A method of manufacturing a semiconductor device, the method comprising:

forming a first etch stop layer over a workpiece;

forming a first insulating material layer over the first etch stop layer;

forming a second etch stop layer over the first insulating material layer;

forming a second insulating material layer over the second etch stop layer;

patterning the second insulating material layer, the second etch stop layer, and the first insulating material layer using a dual damascene process to form patterns for a plurality of conductive features in the second insulating material layer, the second etch stop layer, and the first insulating material layer;

forming a barrier layer over the patterned second insulating material layer, second etch stop layer, and first insulating material layer;

forming a conductive material over the barrier layer to form a plurality of conductive features in the second insulating material layer, the second etch stop layer, and the second insulating material layer;

removing the second insulating material layer between the plurality of conductive features, leaving a portion of the second insulating material layer disposed beneath a portion of each of the plurality of conductive features; and forming a third insulating material layer between the plurality of conductive features.

14. The method according to claim 13, wherein forming the third insulating material layer comprises a spin-on process, an atomic layer deposition (ALD) process, or a flowable process.

15. The method according to claim 13, further comprising pre-treating the second insulating material layer and the first insulating material layer with a material selected from the group consisting essentially of: $NH_3$, $N_2$, $H_2$, and combinations thereof, before forming the barrier layer.

16. The method according to claim 13, wherein the barrier layer includes a dielectric layer, and wherein forming the dielectric layer of the barrier layer comprises a plasma enhanced chemical vapor deposition (PECVD) process or an atomic layer deposition (ALD) process.

17. The method according to claim 13, wherein removing the second insulating material layer between the plurality of conductive features comprises a dry etch back process using plasma oxide or a gas including $C_4F_8$, $N_2$, $O_2$, or Ar.

18. The method according to claim 13, wherein the third insulating material layer is more porous than the first insulating material layer or the second insulating material.

19. The method according to claim 13, wherein the second etch stop layer comprises an etch stop for removing the second insulating material layer between the plurality of conductive features.

20. The method according to claim 13, wherein forming the first insulating material layer or the second insulating material layer comprises a chemical vapor deposition (CVD) process, a plasma enhanced chemical vapor deposition (PECVD) process, a spin-on process, or a physical vapor deposition (PVD) process.

* * * * *